United States Patent [19]
Burt et al.

[11] Patent Number: 5,288,364
[45] Date of Patent: Feb. 22, 1994

[54] SILICON EPITAXIAL REACTOR AND CONTROL METHOD

[75] Inventors: Curtis L. Burt, Glendale; John W. Steele, Chandler, both of Ariz.

[73] Assignee: Motorola, Inc., Schaumburg, Ill.

[21] Appl. No.: 932,820

[22] Filed: Aug. 20, 1992

[51] Int. Cl.$^5$ ............................................. C30B 25/16
[52] U.S. Cl. ..................................... 156/601; 156/610; 156/613; 156/614; 437/234; 118/715; 118/728
[58] Field of Search ............... 156/601, 610, 613, 614, 156/DIG. 64; 437/234; 118/715, 728

[56] References Cited
U.S. PATENT DOCUMENTS

| | | | |
|---|---|---|---|
| 3,567,895 | 3/1971 | Paz | 219/10.77 |
| 4,806,321 | 2/1989 | Nishizawa et al. | 156/601 |
| 4,823,736 | 4/1989 | Post et al. | 118/728 |
| 5,108,792 | 4/1992 | Anderson et al. | 118/725 |

OTHER PUBLICATIONS

Sturm et al, "Temperature Control of Silicon-Germanium Alloy Epitaxial Growth on Silicon Substrates . . .", Jour. Applied Physics vol. 69(1) Jan. 1, 1991 pp. 542–544.

*Primary Examiner*—Robert Kunemund
*Attorney, Agent, or Firm*—Robert F. Hightower; Joe E. Barbee

[57] ABSTRACT

An epitaxial reactor (10) includes a bell jar (11) wherein epitaxial depositions are performed. During an epitaxial deposition cycle, the temperature of the bell jar (11) is monitored by an infrared detector (22). After the temperature reaches a predetermined value, initiation of further epitaxial deposition cycles is inhibited. The control method extends the useful lifetime of heating lamps (12) and bell jar seals thereby reducing the cost of semiconductor wafers (16).

14 Claims, 1 Drawing Sheet

SILICON EPITAXIAL REACTOR AND CONTROL METHOD

BACKGROUND OF THE INVENTION

The present invention relates, in general, to semiconductor processing methods, and more particularly, to controlling the operation of an epitaxial reactor.

Previously, the semiconductor industry has utilized a variety of methods for controlling epitaxial reactors that are used to grow epitaxial layers on semiconductor wafers. One type of epitaxial reactor, often referred to as a barrel reactor, employs a transparent quartz bell jar wherein the epitaxial deposition is performed. Epitaxial layers are formed by releasing a silicon source gas, such as silane, and a dopant into the bell jar, then heating the bell jar's contents. During the deposition cycle, doped silicon is deposited onto the semiconductor wafers. Additionally, silicon is also deposited onto the bell jar's inner surface. Such a layer of silicon is often referred to as silicon haze. The haze functions as a barrier that reduces radiant energy which is transmitted through the bell jar to the wafers from heating lamps external to the bell jar. In order to maintain a constant wafer temperature, the lamp intensity is increased as the haze thickness increases thereby reducing the lamps' lifetime.

Typically, the haze is removed by detaching the bell jar from the reactor, and etching the bell jar with a wet chemical etch. The wet etch operation is detrimental to the seals that prevent air from entering the bell jar during epitaxial deposition cycles. In addition, reassembling the bell jar to the reactor, and re-calibrating the reactor takes between twelve and eighteen hours thereby lowering the reactor's through-put and increasing the reactor's operating cost.

Accordingly, it is desirable to have a method of controlling an epitaxial reactor that monitors the silicon haze, that detects when the haze should be removed, that prevents initiating an epitaxial deposition cycle when the haze should be removed thereby increasing lamp lifetime, and that maximizes the number of deposition cycles that are performed before a wet etch operation is required.

SUMMARY OF THE INVENTION

Briefly stated, the present invention includes a method of controlling an epitaxial reactor. The reactor has a bell jar within which an epitaxial deposition is performed. The temperature of the bell jar is monitored during the epitaxial deposition cycle. After the temperature reaches a predetermined value, initiation of further epitaxial deposition cycles is inhibited. The method extends the useful lifetime of heating lamps and bell jar seals and thereby reduces semiconductor wafer costs.

An apparatus for controlling the epitaxial reactor is also included.

DETAILED DESCRIPTION OF THE DRAWINGS

Figure 1:
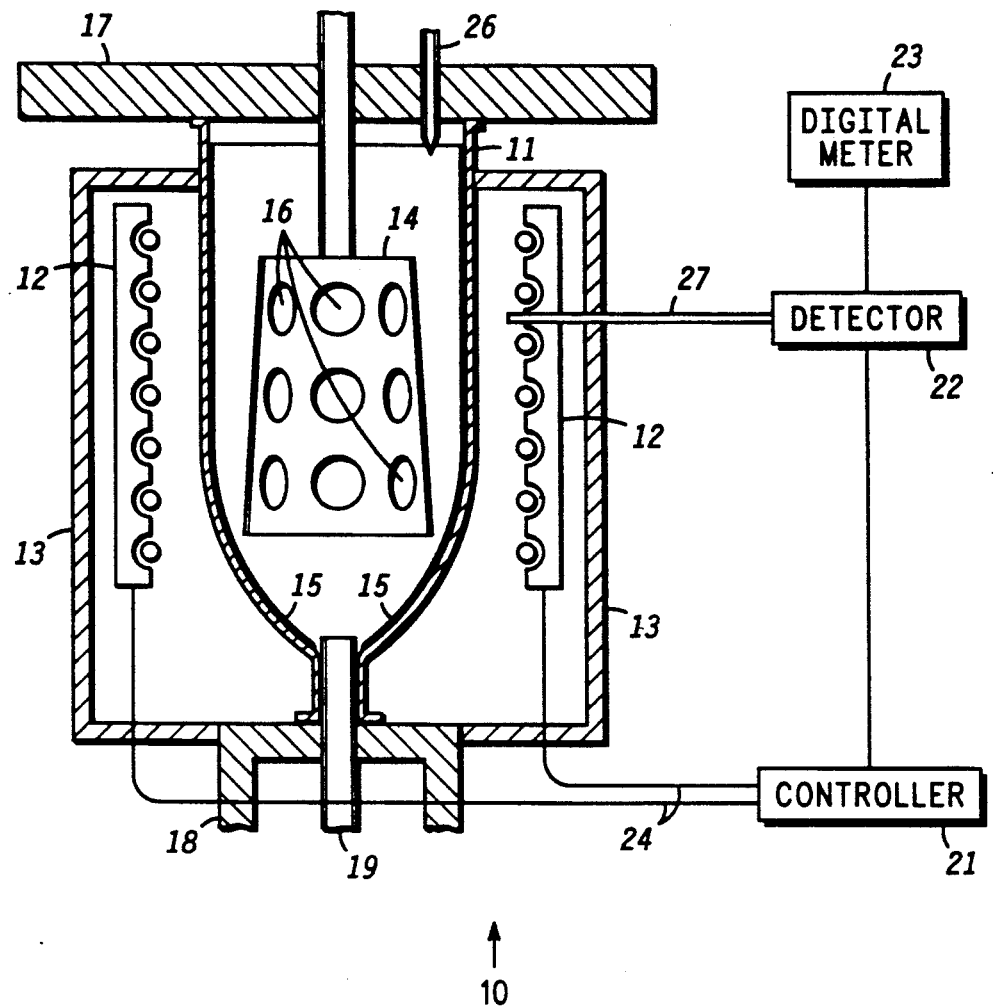
FIG. 1 illustrates a cross-sectional view of an epitaxial reactor in accordance with the present invention.

FIG. 1 illustrates a portion of a silicon epitaxial reactor 10 that includes a transparent bell jar 11. A neck or small end of bell jar 11 is attached to a support 18, while a mouth or large end of bell jar 11 is connected to a support 17. Both the neck and mouth of jar 11 are sealed to supports 17 and 18, respectively, by seals (not shown). A plurality of semiconductor wafers 16 are positioned on a susceptor 14 that is within jar 11. During the process of forming epitaxial layers on wafers 16, a gas inlet 26 is used to provide silicon source gases and dopant gases within jar 11. An exhaust pipe 19 fits through the neck of jar 11 to provide a means of removing gases from the interior of jar 11. During an epitaxial deposition cycle, a plurality of lamps 12 are energized to provide a radiant heat source that heats wafers 16. A containment chamber 13 surrounds bell jar 11 to provide protection in case of an accidental implosion of jar 11. A constant temperature is maintained within jar 11 by a controller 21 which has an input connected to a temperature sensor (not shown) within susceptor 14, and an output connected to plurality of lamps 12 by conductors 24.

During an epitaxial deposition cycle, the silicon source gas within jar 11 forms a layer of silicon or silicon haze 15 along the interior walls of jar 11. In FIG. 1, the thickness of haze 15 is exaggerated for clarity. Haze 15 absorbs a portion of the radiant energy or light from lamps 12 thereby reducing the amount that reaches wafers 16, and reducing the temperature of wafers 16. The temperature decrease is sensed by controller 21 which then increases the power to lamps 12 to maintain a substantially constant temperature.

Silicon is allowed to accumulate on susceptor 14 in order to assist in forming a uniform epitaxial layer thickness on each of wafers 16. Silicon is periodically removed from susceptor 14 by using a procedure commonly referred to as a high etch. During the high etch, gaseous hydrochloric acid is released into jar 11, and susceptor 14 is heated to a temperature of between approximately 1200 and 1300 Celsius (°C.). Such operations are well known to those skilled in the semiconductor art.

It has been found that the high etch operation can also be used to substantially remove haze 15, without disassembling reactor 10, as long as the thickness of the silicon haze is less than a critical thickness. If haze 15 exceeds the critical thickness, reactor 10 must be disassembled, jar 11 removed, and jar 11 etched with a wet hydrochloric acid etch. Although it is difficult to measure the thickness of haze 15, the point where the critical thickness is reached can be determined by monitoring the infrared radiation emitted by jar 11 and haze 15, as will be seen hereinafter. The high etch does not completely remove all of haze 15. Consequently, after repeatedly performing deposition cycles followed by a high etch operation, jar 11 must eventually be removed and cleaned with a wet etch. If the thickness of haze 15 is maintained below the critical thickness between high etch operations, the deposition-etch sequence (i.e. series of deposition cycles followed by a high etch) can be performed several times before the high etch can no longer substantially remove haze 15.

It has been found that the number of deposition-etch sequences can be maximized by monitoring infrared radiation emitted by haze 15 and bell jar 11 with an infrared detector 22. Detector 22 monitors the magnitude of infrared radiation over the range of frequencies to which jar 11 is most transparent. In the preferred embodiment, detector 22 monitors frequencies with wavelengths between approximately two and twenty-one microns. Detector 22 is positioned external to containment chamber 13 in order to prevent the infrared radiation emitted by lamps 12 from affecting the readings of detector 22. A first end of a fiber optic cable 27 is positioned near the external surface of jar 11 in order to accept infrared radiation emitted by jar 11 and haze 15. A second end of cable 27 is connected to an input of detector 22 thereby coupling the infrared radiation into detector 22. Detector 22 transfers the magnitude of the infrared radiation to controller 21 via a connection between a first output of detector 22 and a second input of controller 21. Controller 21 then converts the infrared radiation magnitude to a temperature. A second output of detector 22 is connected to a digital meter 23 that displays the magnitude of infrared radiation detected by detector 22.

As the thickness of haze 15 increases, the temperature of haze 15 and jar 11 also increases thereby increasing the infrared radiation emitted by haze 15 and jar 11. Consequently, the temperature detected by controller 21 can be correlated to the thickness of haze 15, as will be seen hereinafter in FIG. 2. When a predetermined temperature is achieved, controller 21 prevents initiating another epitaxial deposition until haze 15 has been substantially removed. This predetermined temperature varies depending on the epitaxial deposition temperatures, the type of bell jar used, and the temperatures used for the high etch operation. In the preferred embodiment, the epitaxial deposition temperature is approximately 600 degrees Celsius (600° C.), and the predetermined temperature that inhibits subsequent deposition cycles is between approximately 625° C. and 630° C.

Figure 2:
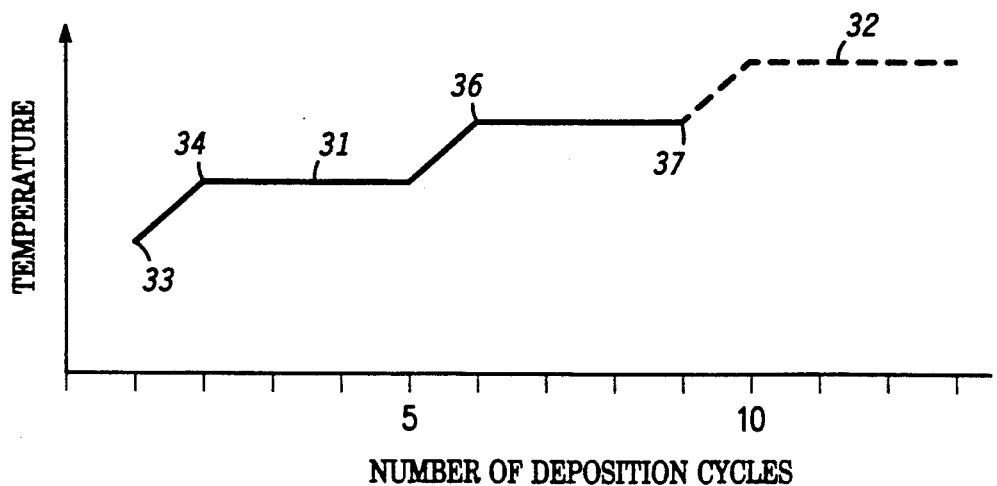
FIG. 2 is a graph illustrating bell jar temperature during a series of epitaxial deposition cycles in accordance with the present invention.

FIG. 2 is a graph illustrating the temperature of haze 15 and bell jar 11 from FIG. 1 versus the number of epitaxial deposition cycles. The ordinate indicates temperature, and the abscissa represents the number of deposition cycles. For clarity, the description of FIG. 2 contains references to the elements of FIG. 1. A plot 31 represents the temperature of haze 15 and jar 11 over a number of deposition cycles. At the beginning of the first deposition cycle, jar 11 is clean and free of haze. Initially, the temperature of haze 15 and bell jar 11 is approximately equal to the temperature of wafers 16. Haze 15 forms during the first cycle so that the temperature of haze 15 and bell jar 11 increases as shown between points 33 and 34. Thereafter, the temperature remains relatively constant as the thickness of haze 15 increases through cycle number 4. During cycle number five, the temperature increases until reaching point 36. During cycles six to eight, the temperature once again remains relatively constant, as shown between points 36 and 37, as the thickness of haze 15 continues to increase. A dashed line 32 indicates the temperature that would be reached during deposition cycle number nine and subsequent deposition cycles ten through twelve. It has been found that prior to deposition cycle nine, haze 15 can be substantially removed by a high etch operation. Subsequent to cycle nine, haze 15 must be removed by a wet etch operation. Consequently, controller 21 permits approximately two deposition cycles subsequent to reaching the temperature indicated by point 36, but inhibits the initiation of further deposition cycles until the haze is removed from jar 11 by a high etch. After the high etch operation, the haze is substantially removed and the deposition-etch sequence is repeated.

After a number of deposition-etch sequences, the residual haze remaining on jar 11 is too great to permit accurately controlling further deposition cycles. At this point, reactor 10 must be disassembled and the haze removed with a wet etch. The number of times the deposition-etch sequence can be repeated depends upon the temperature and acid concentration used during the high etch, the silicon deposition temperature, the silicon source gas, and deposition time. In the preferred embodiment, the deposition-etch sequence typically is repeated approximately four to five times before a wet etch operation is performed. Since the wet etch operation is detrimental to the seals used to seal jar 11 to supports 17 and 18, removing haze 15 with the high etch extends the lifetime of the seals used on jar 11, and minimizes the number of times reactor 10 must be reassembled and re-calibrated thereby lowering manufacturing costs.

By now it should be appreciated that there has been provided a novel way to control a silicon epitaxial reactor. Monitoring the temperature of the bell jar and the silicon haze on the bell jar facilitates determining when a high etch procedure should be utilized to remove the silicon haze. Utilizing the temperature to determine the maximum number of epitaxial deposition cycles that can be performed before a high etch is required, maximizes the number of wafers that can be produced thereby reducing the wafer's manufacturing costs. Cleaning the bell jar with high etch cycles extends the useable lifetime of the reactor's lamps and seals which reduces the reactors operating costs thereby further reducing the wafer's costs. Additionally, this method of controlling the reactor reduces the number of hours the reactor is unavailable for producing wafers thereby increasing the reactor's wafer throughput and even further reducing the wafer's costs.

What is claimed is:

1. A method of controlling a silicon epitaxial reactor comprising:

providing a silicon epitaxial reactor having a quartz bell jar;

positioning an infrared sensor near an external surface of the quartz bell jar;

coupling an output of the infrared sensor to a controller that controls initiating an epitaxial deposition cycle within the silicon epitaxial reactor;

monitoring a temperature of the quartz bell jar by using the infrared sensor for monitoring infrared radiation emitted from the quartz bell jar and from a silicon haze on an inside surface of the bell jar during an epitaxial deposition cycle; and inhibiting initiation of an epitaxial deposition cycle a first number of epitaxial deposition cycles after the temperature reaches a first value wherein the inhibiting is performed by the controller.

2. The method of claim 1 wherein positioning the infrared sensor near the external surface of the quartz bell jar includes positioning a first end of a fiber optic cable near the external surface of the bell jar, and attaching a second end of the fiber optic cable to an input of the infrared sensor.

3. The method of claim 1 wherein allowing the first number of epitaxial deposition cycles after the temperature reaches the first value includes allowing two epitaxial deposition cycles after the temperature reaches the first value.

4. The method of claim 1 wherein inhibiting initiation of the epitaxial deposition cycle the first number of epitaxial deposition cycles after the temperature reaches the first value includes inhibiting initiation of the epitaxial deposition cycle before the temperature reaches a value that indicates a high etch cycle will not remove the silicon haze from the inside surface of the quartz bell jar.

5. The method of claim 4 wherein inhibiting imitation of the epitaxial deposition cycle before the temperature reaches the value includes inhibiting imitation of the epitaxial deposition cycle before the temperature reaches approximately 625 to 630 degrees Celsius.

6. A method of controlling an epitaxial reactor comprising:
   providing an epitaxial reactor having a bell jar;
   monitoring a temperature of the bell jar during an epitaxial deposition cycle; and
   inhibiting initiation of an epitaxial deposition cycle within the epitaxial reactor a first number of epitaxial deposition cycles after the temperature reaches a first value.

7. The method of claim 6 wherein monitoring the temperature includes monitoring infrared radiation emitted from the bell jar by positioning a first end of a fiber optic cable near an external surface of the bell jar for accepting the infrared radiation, coupling a second end of the fiber optic cable to an input of an infrared detector thereby coupling the infrared radiation to the infrared detector.

8. The method of claim 6 wherein inhibiting initiation of the epitaxial deposition cycle includes coupling an output of the infrared detector to a controller wherein the controller performs the inhibiting.

9. The method of claim 6 wherein inhibiting initiation of the epitaxial deposition cycle within the epitaxial reactor the first number of epitaxial deposition cycles after the temperature reaches the first value includes allowing at least two epitaxial deposition cycles after the temperature reaches the first value.

10. The method of claim 6 wherein inhibiting initiation of the epitaxial deposition cycle within the epitaxial reactor includes inhibiting initiation after the temperature reaches approximately 625 to 630 degrees Celsius.

11. The method of claim 6 further including performing a high etch cycle after the step of inhibiting initiation of the epitaxial deposition cycle.

12. An epitaxial reactor comprising:
    a bell jar;
    an infrared detector positioned to accept infrared radiation emitted by the bell jar, the infrared detector having an input and an output; and
    a controller having an input coupled to the output of the infrared detector wherein the controller controls initiation of an epitaxial deposition cycle within the epitaxial reactor.

13. The epitaxial reactor of claim 12 wherein the infrared detector positioned to accept infrared radiation emitted by the bell jar includes a fiber optic cable having a first end positioned near the bell jar thereby accepting the infrared radiation, and a second end coupled to the input of the infrared detector.

14. The silicon epitaxial reactor of claim 12 further including a containment chamber that is positioned between the bell jar and the infrared detector.

* * * * *